(12) United States Patent
Schmid

(10) Patent No.: US 10,032,775 B2
(45) Date of Patent: Jul. 24, 2018

(54) SWITCHING DEVICE FOR SWITCHING RADIO FREQUENCY SIGNALS

(71) Applicant: Rohde & Schwarz GmbH & Co. KG, Munich (DE)

(72) Inventor: Simon Schmid, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 34 days.

(21) Appl. No.: 14/726,175

(22) Filed: May 29, 2015

(65) Prior Publication Data

US 2016/0351567 A1    Dec. 1, 2016

(51) Int. Cl.
| | |
|---|---|
| *H01L 27/095* | (2006.01) |
| *H03K 17/693* | (2006.01) |
| *H01L 27/02* | (2006.01) |
| *H01L 29/778* | (2006.01) |
| *H01L 29/417* | (2006.01) |
| *H01L 27/085* | (2006.01) |

(52) U.S. Cl.
CPC ........ *H01L 27/095* (2013.01); *H01L 27/0207* (2013.01); *H03K 17/693* (2013.01); *H01L 27/085* (2013.01); *H01L 29/4175* (2013.01); *H01L 29/778* (2013.01)

(58) Field of Classification Search
CPC ............................ H01L 27/095; H01L 29/778
See application file for complete search history.

(56) References Cited

U.S. PATENT DOCUMENTS

| | | | | |
|---|---|---|---|---|
| 4,642,259 A | * | 2/1987 | Vetanen | ............ H01L 21/28587 257/284 |
| 5,214,275 A | * | 5/1993 | Freeman | ............... H03K 17/785 250/208.4 |
| 5,338,986 A | * | 8/1994 | Kurimoto | ........... H01L 27/0921 257/372 |

(Continued)

OTHER PUBLICATIONS

Saito eet al. ("High Voltage and High Switching Frequency Power-Supplies using a GaN-HEMT" p. 253-256, 1-4244-0126-7/06/$20.00 02006 IEEE.*

(Continued)

*Primary Examiner* — Marc Armand
*Assistant Examiner* — Sue Tang
(74) *Attorney, Agent, or Firm* — Lee & Hayes, PLLC

(57) ABSTRACT

The invention relates to a switching device for switching radio frequency signals. The switching devices comprises at least a first field effect transistor that comprises a first source node, a first gate node and a first drain node, wherein the first gate node is arranged between a first drain region and a first source region on a semiconductor substrate. The switching device comprises at least a second field effect transistor that comprises a second source node, a second gate node and a second drain node, wherein the second gate node is arranged between a second drain region and a second source region on the same semiconductor substrate. The first source region of the first transistor is directly connected to the second drain region of the second transistor to build a common node of the switching device. An input node and an output node of the switching device are directly connected to the common node. The switching device is built by an even number of field effect transistors on the common semiconductor substrate.

23 Claims, 5 Drawing Sheets

(56) References Cited

U.S. PATENT DOCUMENTS

| | | | | |
|---|---|---|---|---|
| 9,030,182 B2* | 5/2015 | Galloway | ........... | H02M 3/1582 |
| | | | | 323/284 |
| 2004/0140511 A1* | 7/2004 | Nakatani | ............ | H01L 27/0203 |
| | | | | 257/401 |
| 2006/0114051 A1* | 6/2006 | Yasuda | ................ | H03K 17/693 |
| | | | | 327/430 |
| 2007/0131938 A1* | 6/2007 | Williams | ............ | H01L 27/0605 |
| | | | | 257/77 |
| 2009/0302898 A1* | 12/2009 | Sato | ........................... | B41J 2/45 |
| | | | | 327/111 |
| 2011/0233628 A1 | 9/2011 | Parkhurst et al. | | |
| 2015/0042403 A1* | 2/2015 | Laturell | ................ | H03F 3/2175 |
| | | | | 330/251 |
| 2015/0244268 A1* | 8/2015 | Meinecke | ............. | H02M 3/158 |
| | | | | 323/271 |

OTHER PUBLICATIONS ("Field-ffect transistors—Fundamentals—Semiconductor Technology") https://www.halbleiter.org/en/fundamentals/construction-of-a-field-effect-transistor/.*

* cited by examiner

SWITCHING DEVICE FOR SWITCHING RADIO FREQUENCY SIGNALS

FIELD OF THE INVENTION

The invention relates to a switching device for switching radio frequency signals, especially signals in a frequency range from DC to microwave frequencies. The switching device is preferably used in a radio frequency switch. Alternatively or additionally, the switching device is used in an amplifying application in order to amplify a radio frequency signal.

BACKGROUND OF THE INVENTION

A radio frequency switch, short: RF switch, is a device to route an RF signal through a transmission path. An RF switch is used extensively in a microwave test system for an RF signal routing between an instrument, such as a signal generator or a measuring device, and a device under test, short: DUT. Incorporating an RF switch into a RF switch matrix system enables to route an RF signal from single or multiple instruments to single or multiple DUTs. This allows multiple tests to be performed with the same setup, eliminating the need for frequent connects and disconnects. Similar to an electrical switch, an RF switch comes in different configurations providing the flexibility to create complex matrices and automated test systems for many different applications.

There are single-pole-double-throw RF switches, short SPDT-switches that route an RF signal from one input terminal to two output terminals. There are single-pole-multiple-throw RF switches, short SPnT-switches that route an RF signal to multiple, at least three or more, output terminals.

Alternatively, an RF switch might be employed to selectively connect an antenna of a communication device with either transmit or receive circuitry of the device or with a signal path among a plurality of other components.

An RF switch should be designed to not influence the RF signal while routing the RF signal. Therefore, an RF switch is characterized by its frequency range, its insertion loss, its return loss, its repeatability, its isolation, its switching speed, its setting time, its power handling, its termination, its video leakage, its non-linearity and its operating life. Those parameters of an RF switch are used to classify the RF switch for a specific application.

Nowadays, an RF switch utilizes at least one field effect transistor, short FET, as a switching device. A FET comprises excellent parameter values to not influence the RF signal during routing. Thus, proper values for the above cited RF switch characteristics are obtained when using a FET. When operating a FET in an RF switch, the drain destination and the source destination of the FET are typically not meaningful as the FET is operated in a symmetric fashion.

A switching device according to the invention is preferably used as a shunt element in an RF switch. In electronics, a shunt element is a device which allows electric current to pass around another point in the circuit by creating a low resistance path.

In general, there are a number of parasitic capacitances associated with a FET used as a switching device in an RF switch arising from the FET itself. Additionally, various resistive and capacitive components employed in the RF switch or electrical traces connected to the RF switch might lead to the parasitic capacitances as well. These capacitances can degrade various aspects of the FET switching performance. In particular, a parasitic gate capacitance to ground degrades the linearity of the FET switch and results in degraded harmonic and intermodulation performances for the FET in the RF switch. Additionally, harmonic distortion occurs, which is a main effect on the transistors capacitances.

In US 2011/0233628 A1, a FET structure as a switching device for RF signals is described. To avoid a parasitic capacitance from the gate to the ground, it is proposed to connect a drain node to a gate node via a series connection of a resistor and a capacitor to obtain a high frequency conducting bridge. Thus, the gate node follows the RF signal applied to the drain node.

A drawback of this technique is the fact that the high frequency bridge is not working with low frequency signals. At low frequency signals, the series connection from the gate node to the drain node becomes highly resistive and blocks the RF signal. Additionally, harmonic distortions of the RF signals generated by the parasitic capacitances of the FET cannot be avoided with such a structure.

When using such a FET structure as a shunt element in an RF switch, the FET channel is asymmetrically connected to a specific voltage potential, preferably ground potential of a supply voltage. Such an asymmetric arrangement to ground increases the parasitic capacitance of the FET and leads to an unwanted non-linear distortions of an RF signal while routing.

Thus, there is a need to provide an RF switching device that is flexible in its use and can be operated in a great variety of applications. The RF switching device should at least operate in a frequency range from DC to microwave frequencies. The parasitic capacitance of the RF switching device and especially the harmonic distortion should be further reduced.

SUMMARY OF THE INVENTION

According to one aspect of the invention, a switching device for switching radio frequency signals is proposed. The switching device comprises at least a first field effect transistor that comprises a first source node, a first gate node and a first drain node, wherein the first gate node is arranged between a first drain region and a first source region on a semiconductor substrate. The switching device comprises at least a second field effect transistor that comprises a second source node, a second gate node and a second drain node, wherein the second gate node is arranged between second drain region and a second source region on the same semiconductor substrate. The first source region of the first transistor is directly connected to the second drain region of the second field effect transistor to build a common node of the switching device. Preferably an input node and an output node of the switching device are directly connected to the common node. Preferably, the switching device is built by an even number of field effect transistors on the common semiconductor substrate.

An even number is an integer which is evenly divisible by two. This means that if the integer number of FETs is divided by 2, it yields no remainder. The even number is positive. The term "even number" is identical to the term "even numbered integer".

The direct connection between the first source region and the second drain region of the respective FETs on the same substrate leads to a pair-wise connection of two individual FETs. Thus, equilibrium is obtained, since the drain-to-source voltage of the first FET is equal to the negative drain-to-source voltage of the second FET. Thus, the parasitic capacitance of the first FET is fully compensated with the capacitance of the second FET. Thus, a harmonic distortion is fully compensated or at least heavily reduced. At least the second harmonic distortion products, short HD2-products, are suppressed. The total harmonic distortion, short THD, of a signal is a measurement of the harmonic distortion present and is defined as the ratio of the sum of the powers of all harmonic components to the power of the fundamental frequency. THD is used to characterize the linearity and the power quality of a transmission system.

This inventive structure for a switching device allows RF signal switching within a frequency range of DC to microwave frequencies. Microwave frequencies might range from 300 Megahertz to 300 Gigahertz. The switching device comprises very low harmonic distortion and can handle high power signals, wherein DC capability and a spike free switching is always achieved.

The total parasitic capacitance of the first FET is modulated in reverse polarity to the total parasitic capacitance of the second FET. Thus, the HD2-products are cancelled. The resistance value of the switching device is highly constant over the frequency range.

Having the drain regions and the source regions on the common semiconductor substrate of the switching device leads to an easy manufacturing of the switching device, since the regions can be built equally and are categorized as drain and/or source region only by a respective connection of the specific region.

The term "node" is hereinafter referred to the electrical terminal of the specific transistor in an electrical equivalent circuit. The term "region" is hereinafter referred to the respective geometric region in the common semiconductor substrate.

In a preferred embodiment, the respective drain regions and source regions in the common substrate are arranged side-by-side. Thus, a simple connection to build the common node is possible without adding additional connection layers.

In a preferred embodiment, drain regions and the source regions are equally dimensioned. Thus, the regions are built independently and the respective region becomes either a drain region or a source region only in dependence on the connection and the respective signal that is applied thereto.

In a preferred embodiment, the FETs of the switching device are depletion mode transistors of one specific channel type, preferably p-channel typ. Especially, the FETs on the common substrate are of one channel type, either p-channel or n-channel. Thus, the common substrate is easily manufactured and the specific drain regions and source regions can be directly connected in an easy manner.

In a preferred embodiment, the FETs of the switching device are metal-semiconductor FETs, short MESFETs. Such MESFETS are quite similar to Joint-FETs, short JFETs in construction and terminology. Instead of using a p-in-junction for the gate node, a Schottky junction or a metal-semiconductor junction is used. The MESFET structure is used to avoid high quality surface passivation. Thus, the MESFETs are faster than silicon based MOSFETs. MESFETs are used for microwave frequency communications and are useful for quick switching applications. The FETs are preferably built by a gallium-nitride process or a gallium-arsenide process.

In a preferred embodiment, the gate node is asymmetrically arranged between the drain region and the source region of the respective FET, wherein the distance to the source region is smaller than the distance to the drain region.

Thus, an RF resistance is further reduced and thus the resistive and capacitive parasitic effects are decreased.

In a preferred embodiment, the first drain node of the first transistor is connected to a first voltage potential, preferably a positive voltage potential. Thus, a first half of the FET channels of the switching device is connected to the first voltage potential.

In a preferred embodiment, the second source node of the second transistor is connected to a second voltage potential, preferably the reference potential. Thus a second half of the FET channels of the switching device is connected to ground potential.

Having the first half of the channels connected to the first voltage potential and the second half of channels connected to the second voltage potential leads to the anti-parallel configuration and compensates the parasitic capacitances and suppresses the THD.

Preferably, the connection to ground is achieved with a via or a through-hole arranged in the common semiconductor substrate.

In a preferred embodiment, the field effect transistors are high-electron-mobility-transistors, short HEMT-FETs, preferably on gallium-nitride basis. Such transistors can operate at very high frequencies since the transistor incorporates a junction between two materials with different band gaps as the channel instead of a doped region as used in MOSFETs. Gallium-nitride HEMT-FETs comprise brilliant high-power performance parameters.

In a preferred embodiment, the FETs are not sealed so they can be used in microwave arrangements.

In a preferred embodiment, the first FET and the second FET form a transistor module, wherein a first transistor module is arranged in mirror symmetric to a second transistor module on the common substrate. A doubling of the number of FETs leads to a doubling of drain or respective source region and leads to the half of the RF resistance caused by the FET. Thus, the distortion is further reduced and the capability of the RF switching device in handling high power frequency signals is significantly increased.

In a preferred embodiment, the number of transistor modules is even. This leads to a symmetric arrangement of the RF switching device and achieves a very low RF resistance.

In a preferred embodiment, the common nodes of the transistor modules are jointly connected and form an input and an output node of the switching device. The anti-parallel connection of FETs to the input node and output node of the switching device compensates the total parasitic capacitances of each single FET.

In a preferred embodiment, all first drain nodes are jointly connected to a first voltage potential. This avoids a high number of connecting pads and avoids further resistive parasitic effects.

In a preferred embodiment, the first gate nodes of the transistor modules are jointly connected and form a first control node of the switching device. The second gate nodes of the transistor modules are also jointly connected and form a second control node of the switching device.

The jointly connecting of the respective first or second gate nodes leads to a single connecting pad of the switching device, which reduces the wiring effort and thus the parasitic effects are reduced.

In a preferred embodiment, all gate nodes are jointly connected and form a common control node of the switching device. Thus, the gate voltage of the first transistors module is totally equal to the gate voltage of the second transistors module. Thus, the switching effect of the different FETs is aligned.

In this inventive concept, a first half of FET channels is connected to a first voltage supply potential, wherein the remaining other half of channels of the FET is connected to a second voltage supply potential, preferably the ground potential. The suggested anti-parallel configuration for driving the RF signal thus leads to a symmetric loading of the capacitances of the respective FET and avoids harmonic distortions.

In a preferred embodiment, the switching device is used as a shunt element. These shunt elements are for instance used in RF switches or ammeters, so the accuracy is highly increased using the above-described structure. Especially, the isolation of the RF switches is increased through the inventive shunt element.

In a preferred embodiment, the switching device is used in a multiport RF switch or in a single-pole-double-throw RF switch or in a single-pole-multiple-throw RF switch.

In a preferred embodiment, the switching device is used in an amplifying module.

BRIEF DESCRIPTION OF THE DRAWINGS

In the following exemplary embodiments of the invention are described with reference to drawings by way of example only. Those exemplary embodiments do not limit the scope of the invention. The same reference signs in different drawings indicate the same elements or at least the same functions unless otherwise stated. In the drawings.

DETAILED DESCRIPTION OF THE PREFERRED EMBODIMENTS

Figure 1:
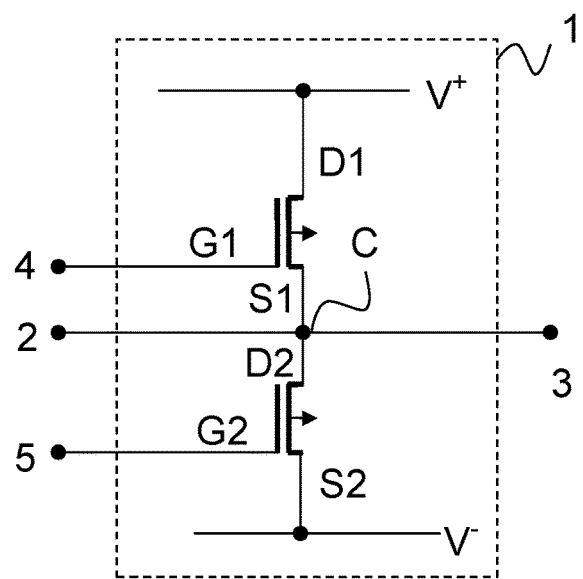
FIG. 1 shows a first exemplary embodiment of a switching device according to the invention.

FIG. 1 shows a first exemplary embodiment of an inventive switching device 1. The switching device 1 comprises a first FET Q1. The first FET Q1 comprises a first gate node G1, a first drain node D1 and a first source node S1. The switching device 1 further comprises a second FET Q2. The second FET Q2 comprises a second gate node G2, a second drain node D2 and a second source node S2. According to the invention, the first source node S1 is directly connected to the second drain node D2. This leads to a pair-wise connection of two FETs and leads to a symmetric loading of a signal path which is applied here as an input node 2 and an output node 3 of the switching device 1. Additionally, the first gate node G1 is a first control node 4 of the switching device 1. The second gate node G2 is a second control node 5 of the switching device 1. The switching device 1 according to FIG. 1 comprises two voltage supply potentials, wherein the first drain node D1 of the first FET Q1 is connected to a first voltage potential $V^+$ and wherein the second source node S2 of the second FET Q2 is connected to a second voltage potential $V^-$.

The first FET Q1 and the second FET Q2 are built on a common semiconductor substrate in such a way, that the respective drain regions and source regions are arranged side-by-side. The respective drain regions and source regions are arranged in parallel in the common semiconductor substrate, wherein the drain regions and the source regions are equally dimensioned. Thus, the respective regions are totally equal and only the connection of said regions leads to the described FET structure.

In a preferred embodiment the same switching signal is applied at the first control node 4 and the second control node 5 of the switching device 1. The signal path between the input node 2 and the output node 3 of the switching device 1 is thus connected in an anti-parallel configuration and leads to a shunt element.

The first FET Q1 and the second FET Q2 are built with the same transistors channel type, e.g. a p-channel or an n-channel. Preferably, the first FET Q1 and the second FET Q2 are built as a p-channel depletion mode FET.

Figure 2:
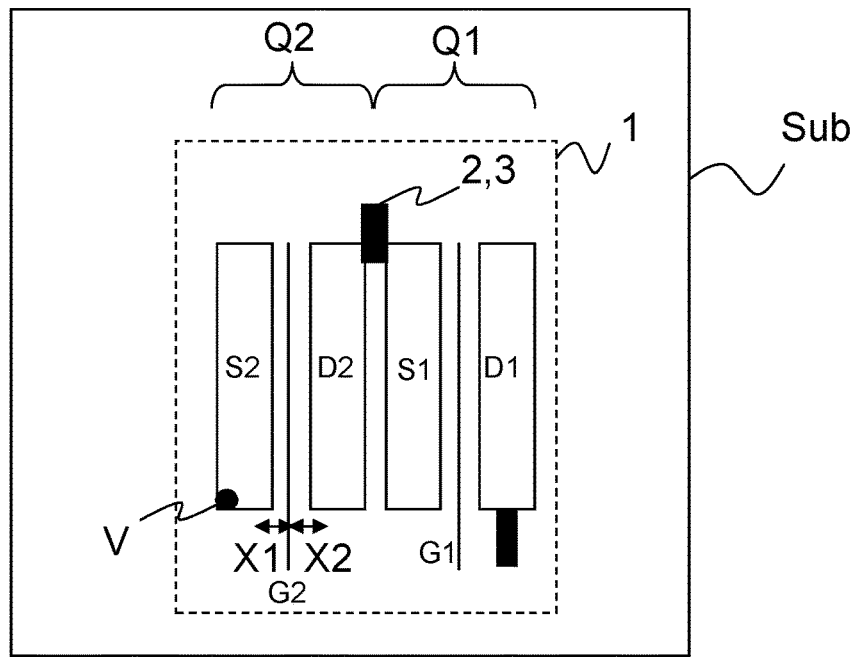
FIG. 2 shows a schematically drawn top view of the first exemplary embodiment according to FIG. 1 on a common semiconductor substrate.

Now referring to FIG. 2, the switching device 1 according to the first exemplary embodiment according to FIG. 1 is shown as a schematically drawn top view on a common semiconductor substrate sub. The first source region S1 and the second drain region D2 are commonly connected to build the input node 2 and the output node 3 of the switching device 1. Between the first drain region D1 and the first source region S1 of the first FET Q1, the first gate node G1 is arranged. According to FIG. 2, the distance x1 between the first gate node G1 and the first drain region D1 is equal to the distance x2 of the first gate node G1 and the first source region S1 of the FET Q1. The first drain region D1 is connected to the first voltage potential V+. The first FET Q1 and the second FET Q2 build one transistor module M1.

Additionally, the second gate node G2 is arranged between the second drain region D2 and the second source region S2 of the FET Q2, wherein the distances x1 and x2 are also equal. The source region S2 is connected to a second voltage potential $V^-$ by a via V or a through-hole in the semiconductor substrate sub.

The first FET Q1 and the second FET Q2 are HEMT-FETs which comprises a junction between two materials of different band gaps as the channel instead of a doped material as used in MOSFETs. The HEMT FET is built on gallium-nitride basis to allow high power performance. To allow conduction, the semiconductors are doped with impurities which the high mobile electrons are holes. All of these electrons are slowed down through collisions with the impurities used to generate them in the first place. HEMT-FETs avoid this through the use of high mobility electrons generated using the heterojunction of a highly doped wide-band gap supply layer, through instance aluminium-gallium-arsenide, short AlGaAs and a non-doped narrow band gap channel layer with no doped impurities such as gallium arsenide. Such a HEMT-FET allows RF signal switching without high parasitic effects.

Figure 3:
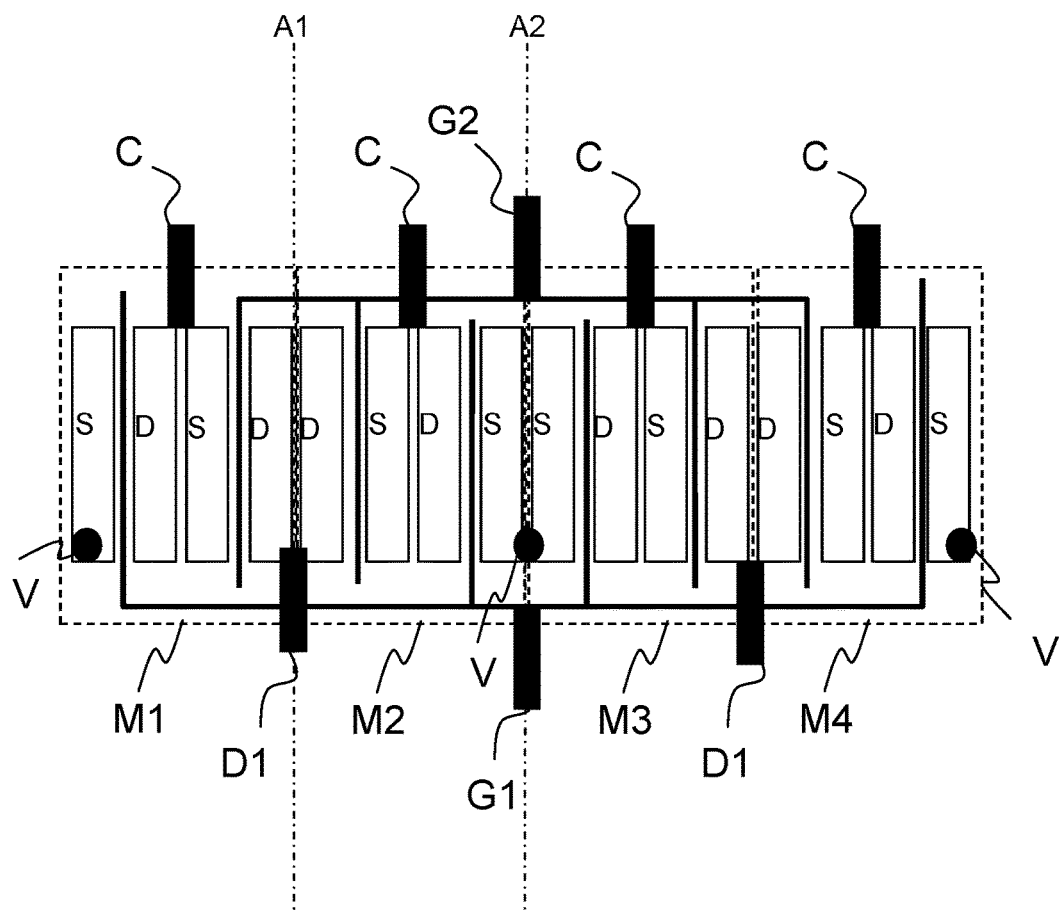
FIG. 3 shows a schematically drawn top view of a second exemplary embodiment of a switching device according to the invention on a common semiconductor substrate.

Now referring to FIG. 3, the switching device 1 is shown according to a second exemplary embodiment as a schematic drawn top view on a common semiconductor substrate sub. In contrast to FIG. 2, the top view of the common semiconductor substrate sub now shows four transistor modules M1, M2, M3 and M4 (dotted lines). Each transistor module M1, M2, M3 and M4 is built as shown in FIG. 2. On a first symmetric axis A1, the first transistor module M1 is mirror symmetrically arranged to a second transistor module M2. The first transistor module M1 and the second transistor module M2 are again mirror symmetrically arranged to the third transistor module M3 and the fourth transistor module M4, wherein the mirror axis A2 is also shown in FIG. 3. All common nodes C refer to a direct connection of a drain region and a source region of the first FET Q1 and the second FET Q2 respectively. All common nodes C are jointly connected to provide one input node 2 and one output node 3.

Furthermore, all first gate nodes G1 are jointly connected to provide a first control node 4. Respectively, the second gate nodes G2 are jointly connected to provide a second control node 5. In FIG. 3, three vias V are shown on the separated source nodes S2 to allow a connection to the second voltage potential $V^{31}$.

Preferably, the switching device 1 comprises a mirror symmetric arrangement of FETs of an even number in order to allow a symmetric load of the signal path between the input node 2 and the output node 3 of the switching device 1. Since the drain regions D and source regions S in the common semiconductor substrate sub are of the same material, a manufacturing of such a switching device 1 is obtained in a cost efficient manner.

Figure 4:
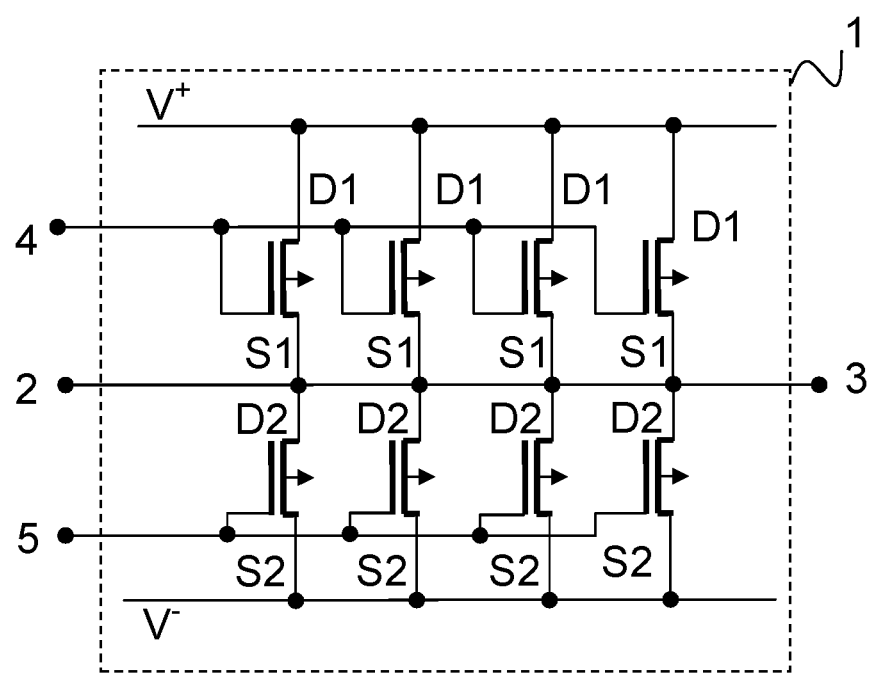
FIG. 4 shows an equivalent circuit of the second exemplary embodiment according to FIG. 3.

In FIG. 4, an equivalent electrical circuit of the second exemplary embodiment according to FIG. 3 is shown. In contrast to the switching device 1 according to FIG. 1, the switching device 1 according to FIG. 4 comprises eight FETs. The FETs are arranged in parallel wherein one pair of FETs consists of a first FET Q1 and a second FET Q2 according to FIG. 1. This parallel and pair-wise arrangement leads to a symmetric loading of the signal path between the input node 2 and the output node 3. Thus the switching device 1 can be used as a shunt element, which is connected to the first voltage potential $V^{30}$ with a first half of FET channels and to the second voltage potential $V^-$ with a second half of FET channels to achieve an anti-parallel configuration and reduce the parasitic effects of the transistors.

Figure 5:
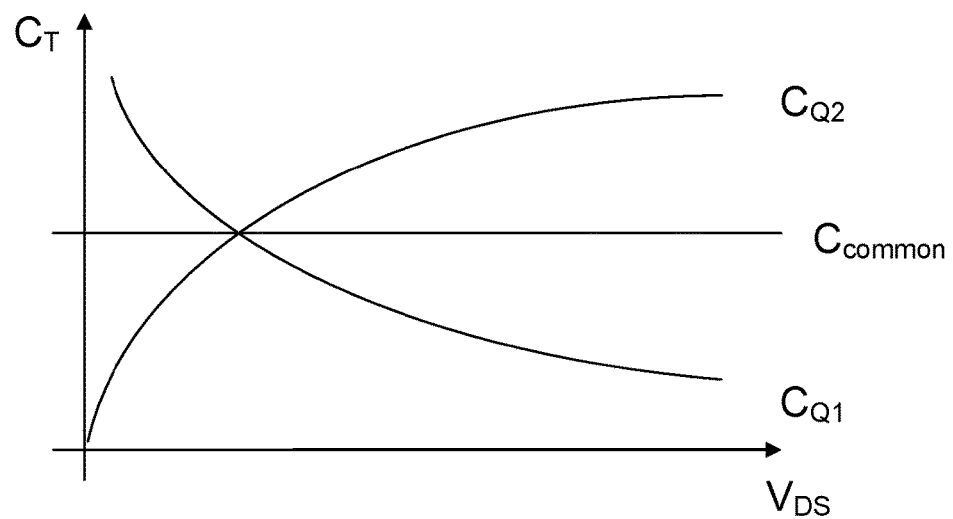
FIG. 5 shows a characteristic curve of the resulting parasitic capacitance of the inventive RF switch in dependence on the drain source voltage.

Now referring to FIG. 5, a characteristic curve of the transistors parasitic capacitance $C_T$ is drawn independence on the drain-source voltage $V_{DS}$. The first FET Q1 comprises a decreasing total capacitance $C_{Q1}$ wherein the second FET Q2 comprises a respectively increasing total capacitance $C_{Q2}$. Using the inventive concept, the common capacitance $C_{common}$ derived by pair-wise connecting the first source node S1 to the second drain node D2 according to FIG. 1 leads to a linear behavior of the common total transistor capacitance $C_{common}$ and therefore does not generate non-linear distortions, such as HD2 products.

Figure 6:
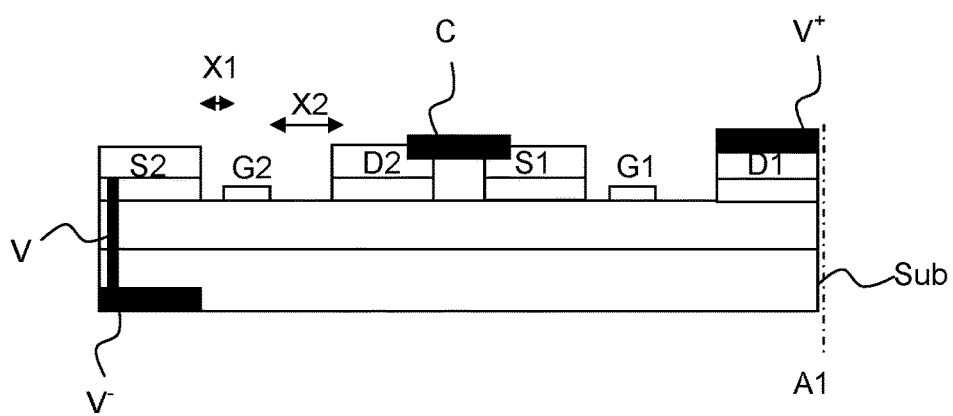
FIG. 6 shows a schematically drawn cross section of a third exemplary embodiment of the inventive switching device on a common semiconductor substrate.

In FIG. 6, a cross section of a common semiconductor substrate sub is shown as a third exemplary embodiment of the inventive switching device 1. Therein asymmetric arrangements of the gate nodes G1, G2 in between the drain regions D1, D2 and the source regions S1, S2 are shown. As can be derived from FIG. 6, the first distance x1 between the first gate node G1 and the first source region S1 of the first FET Q1 is smaller than the second distance x2 between the first gate node G1 and the first drain region D1. Accordingly, the first distance x1 between the second gate node G2 and the second source region S2 of the second FET Q2 is smaller than the second distance x2 between the second gate node G2 and the second drain region D2. The asymmetric arrangements of the gate nodes G1, G2 lead to a reduction of an RF resistance of the FETs and thus lead to a switching device 1 with less parasitic components.

According to FIG. 6, the common node C is connecting the first source node S1 and the second drain node D2 to obtain an input node 2 and an output node 3 of the switching device 1 with a symmetric load to achieve a shunt element without parasitic elements. The total capacitance $C_{Q1}$ of the first FET Q1 is modulated in reverse polarity to the total capacitance $C_{Q2}$ of the second FET Q2 which leads to a linear common capacitance $C_{common}$. Thus, the harmonic distortion products are suppressed. The number of FETs used in the RF switching device 1 is not limited herein.

The resulting RF voltage is equal to the drain source voltage $+V_{DS}$ of the second FET Q2 and is equal to the negative voltage $-V_{DS}$ of the first FET Q1. As higher the area of the respective regions of the switching device 1 are, as lower is the RF resistance of the switching device 1. Each doubling of the area decreases the resistor per factor 2.

Figure 7:
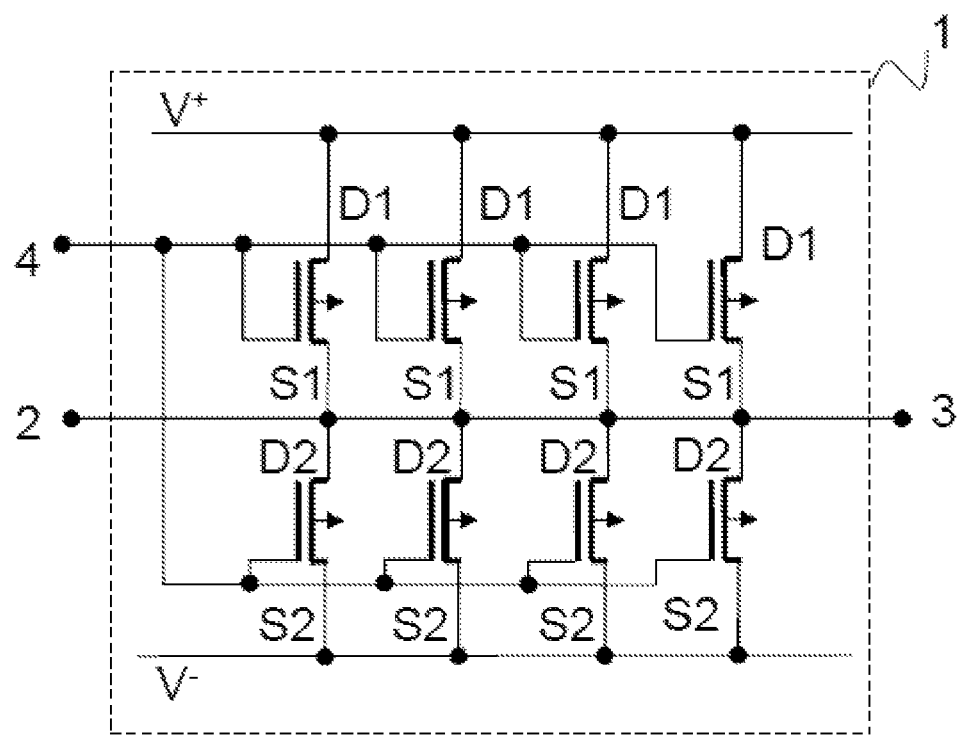
FIG. 7 shows one example circuit in which all gate nodes are jointly connected and form a common control node of the switching device.

In FIG. 7, one example circuit in which all gate nodes are jointly connected and form a common control node of the switching device is shown.

All features of all embodiments described, shown and/or claimed herein can be combined with each.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A device for switching radio frequency signals, comprising:
    at least a first field effect transistor that comprises a first source node, a first gate node and a first drain node, wherein the first gate node is arranged between a first drain region and a first source region on a semiconductor substrate; and
    at least a second field effect transistor that comprises a second source node, a second gate node and a second drain node, wherein the second gate node is arranged between a second drain region and a second source region on the same semiconductor substrate;
    wherein the first source region of the first field effect transistor is directly connected to the second drain region of the second field effect transistor to create a common node of the device;
    wherein an input node and an output node of the device are directly connected to the common node;
    wherein a signal path between the input node and the output node of the device is connected in an anti-parallel configuration;
    wherein the first field effect transistor and the second field effect transistor form a first transistor module;
    wherein a second transistor module is arranged mirror symmetric to the first transistor module on the same semiconductor substrate;

wherein the first gate node of the first transistor module and the first gate node of the second transistor module are jointly connected and form a first control node of the device; and wherein the second gate node of the first transistor module and the second gate node of the second transistor module are jointly connected and form a second control node of the device.

2. The device according to claim 1, wherein the device is created by an even number of field effect transistors on the same semiconductor substrate.

3. The device according to claim 1, wherein a respective drain region and source region in the same semiconductor substrate are arranged side-by-side.

4. The device according to claim 1, wherein the first drain region, the second drain region, the first source region, and the second source region are equally dimensioned.

5. The device according to claim 1, wherein the first field effect transistor and the second field effect transistor of the device are depletion mode transistors.

6. The device according to claim 1, wherein the first field effect transistor and the second field effect transistor of the device are metal-semiconductor field effect transistors.

7. The device according to claim 1, wherein the first gate node is asymmetrically arranged between the first drain region and the first source region of the first field effect transistor, and wherein a distance of the first gate node to the first source region is smaller than a distance of the first gate node to the first drain region.

8. The device according to claim 1, wherein the first drain node of the first field effect transistor is connected to a first voltage potential.

9. The device according to claim 1, wherein the second source node of the second field effect transistor is connected to a second voltage potential.

10. The device according to claim 1, wherein a connection to ground is achieved with a via arranged in the common semiconductor substrate.

11. The device according to claim 1, wherein the first field effect transistor and the second field effect transistor are high-electron-mobility-transistors.

12. The device according to claim 1, wherein the first field effect transistor and the second field effect transistor are not sealed by sealing means.

13. The according to claim 1, wherein all gate nodes are jointly connected and form a common control node of the device.

14. The device according to claim 1, wherein the common node of the first transistor module and a common node of the second transistor module are jointly connected and form an input node and an output node of the device.

15. The device according to claim 1, wherein all first drain nodes are jointly connected to a first voltage potential.

16. The device according to claim 1, wherein all second source nodes are jointly connected to a second voltage potential.

17. The device according to claim 16, wherein a connection to ground is achieved with vias arranged in the common semiconductor substrate.

18. The device according to claim 1, wherein the device is used as a shunt element.

19. The device according to claim 1, wherein the device is used in a multiport RF switch or in a single-pole-double-throw RF switch or in a single-pole-multiple-throw RF switch.

20. The device according to claim 1, wherein the device is used in an amplifying module.

21. A device for switching radio frequency signals, comprising:
at least a first field effect transistor that comprises a first source node, a first gate node and a first drain node, wherein the first gate node is arranged between a first drain region and a first source region on a semiconductor substrate; and
at least a second field effect transistor that comprises a second source node, a second gate node and a second drain node, wherein the second gate node is arranged between a second drain region and a second source region on the same semiconductor substrate;
wherein the first source region of the first field effect transistor is directly connected to the second drain region of the second field effect transistor to create a common node of the device;
wherein an input node and an output node of the device are directly connected to the common node;
wherein a signal path between the input node and the output node of the device is connected in an anti-parallel configuration;
wherein the first field effect transistor and the second field effect transistor form a first transistor module;
wherein a second transistor module is arranged mirror symmetric to the first transistor module on the same semiconductor substrate; and
wherein all gate nodes are jointly connected and form a common control node of the device.

22. A device for switching radio frequency signals, comprising:
at least a first field effect transistor that comprises a first source node, a first gate node and a first drain node, wherein the first gate node is arranged between a first drain region and a first source region on a semiconductor substrate; and
at least a second field effect transistor that comprises a second source node, a second gate node and a second drain node, wherein the second gate node is arranged between a second drain region and a second source region on the same semiconductor substrate;
wherein the first source region of the first field effect transistor is directly connected to the second drain region of the second field effect transistor to create a common node of the device;
wherein an input node and an output node of the device are directly connected to the common node;
wherein a signal path between the input node and the output node of the device is connected in an anti-parallel configuration;
wherein the first field effect transistor and the second field effect transistor form a first transistor module;
wherein a second transistor module is arranged mirror symmetric to the first transistor module on the same semiconductor substrate; and
wherein all second source nodes are jointly connected to a second voltage potential.

23. The device according to claim 22, wherein the second voltage potential is a reference potential.

* * * * *